United States Patent
Guardado et al.

(10) Patent No.: US 12,256,474 B2
(45) Date of Patent: Mar. 18, 2025

(54) SHORT CIRCUIT DETECTION MODULE

(71) Applicant: II Stanley Co., Inc., Battle Creek, MI (US)

(72) Inventors: Eleazar Padilla Guardado, Novi, MI (US); José Miguel Mercado Peña, Canton, MI (US)

(73) Assignee: II STANLEY CO., INC., Battle Creek, MI (US)

( * ) Notice: Subject to any disclaimer, the term of this patent is extended or adjusted under 35 U.S.C. 154(b) by 0 days.

(21) Appl. No.: 17/552,846

(22) Filed: Dec. 16, 2021

(65) Prior Publication Data

US 2022/0191991 A1    Jun. 16, 2022

Related U.S. Application Data

(60) Provisional application No. 63/125,997, filed on Dec. 16, 2020.

(51) Int. Cl.
*H05B 45/50* (2022.01)
*G01R 31/44* (2020.01)
*G07C 5/08* (2006.01)
*G08B 21/18* (2006.01)

(52) U.S. Cl.
CPC .............. *H05B 45/50* (2020.01); *G01R 31/44* (2013.01); *G07C 5/0816* (2013.01); *G08B 21/185* (2013.01)

(58) Field of Classification Search
CPC ...... H05B 45/50; G01R 31/44; G07C 5/0816; G08B 21/185
See application file for complete search history.

(56) References Cited

U.S. PATENT DOCUMENTS

| | | | |
|---|---|---|---|
| 10,014,798 B1 | 7/2018 | Vinciarelli | |
| 11,091,088 B2* | 8/2021 | Padilla Guardado | .. H05B 35/00 |
| 2013/0016310 A1* | 1/2013 | Kanemitsu | ............. H05B 45/10 |
| | | | 349/69 |
| 2017/0109997 A1* | 4/2017 | Brooks | .................. G01R 31/44 |
| 2020/0078119 A1 | 3/2020 | Henderson et al. | |

FOREIGN PATENT DOCUMENTS

| | | | | |
|---|---|---|---|---|
| CN | 102612236 A | * | 7/2012 | ......... H05B 33/0887 |
| EP | 3419387 A1 | * | 12/2018 | |
| EP | 3741622 A1 | * | 11/2020 | ........... B60Q 11/005 |

\* cited by examiner

*Primary Examiner* — Curtis A Kuntz
*Assistant Examiner* — James E Munion
(74) *Attorney, Agent, or Firm* — The Dobrusin Law Firm, P.C.

(57) ABSTRACT

A Short Circuit Detection module capable of detecting a fail related with the Short circuit condition in one or more LEDs contained in a series connection string comply with the failure mode (One out-All out) and can send a single failure signal to a body control module (BCM). The Short Circuit Detection module also includes a lamp driver circuit adapted to detect a change in LED current or voltage that is indicative of a LED light source failure and thereafter output the failure signal to the BCM.

8 Claims, 2 Drawing Sheets

SHORT CIRCUIT DETECTION MODULE

CROSS REFERENCE TO RELATED APPLICATIONS

This application claims priority and benefit to Provisional Patent Application Ser. No. 63/125,997 filed on Dec. 16, 2020 and is incorporated herein by reference.

TECHNICAL FIELD

The present specification relates to control circuits for exterior vehicle lighting and control circuits for detecting a LED in short circuit condition in string of two or more LEDs in series.

BACKGROUND

Light Emitting Diodes (LEDs) have begun to replace incandescent lighting and other forms of lighting in automotive vehicle lamps. The LED lights provide numerous advantages over other forms of lighting, including improved luminescence and reduced power consumption. With the increased use of LED lights in automotive lighting, several automotive lighting standards have imposed certain requirements on monitoring failures in automotive LEDs. In particular, certain lighting standards require vehicles to include a failure mode of "one out-all out" in LED arrays with two or more LEDs in series. Under a "one out-all out" arrangement, if one of the LEDs within the array fails, the rest of the LEDs within the array must also be turned off as well. Several automotive lighting standards require a failure mode (one out-all out) in LED arrays with two or more LEDs in series.

Some System of Lamps demand the failure mode "one out-all out." This condition demand that if one of the LEDs fail, the rest of the LEDs need be turn off.

The most common failures in the LEDs are: Open circuit and short circuit. The driver used to control the current in the light systems can detect an open circuit and provide the fail status, however in the case of the short circuit the requirement demand sense each LED to verify the short circuit condition, this type of solution increase the logic and with this the cost of the additional electronics and area to place the components. However, in most cases the LED driver is unable to detect a short circuit condition at an LED within an array. Moreover, in order to comply with regulations, it would be required that certain LED light systems be retrofitted with the short circuit detection capability, which may be both costly and difficult to implement.

SUMMARY

The Short Circuit Detection has the property of providing and detecting the "short circuit failure" in one or more of the LEDs contained into the string in series connection.

An LED short circuit detection system including an LED light source, an incandescent light source, and a failure detection circuit including an LED driver circuit adapted to monitor the current or voltage across the LED light source for detecting an LED light source outage, and an outage detection module adapted to monitor the current to the incandescent light source for detecting an incandescent light source outage, wherein the failure detection circuit is configured to transmit a lamp failure signal to a body control module to cause a driver warning in response to a detected light source outage.

A method of detecting a short circuit within an LED lighting system, the system including an LED light source, an outage detection module, an LED driver circuit, a body control module, and an incandescent light source, the method including the steps of monitoring the current or voltage across the LED light source for detecting an LED light source outage by the LED driver circuit, monitoring by the outage detection module the current to the incandescent light source for detecting an incandescent light source outage, and transmitting a lamp failure signal to the body control module to cause a driver warning in response to a detected light source outage.

In one embodiment, the Short Circuit Detection includes the electronics to sense the Forward Voltage of the LEDs to provide a fail status in case that one the LEDs involved present a "short circuit failure."

The Short Circuit Detection can be implemented as an additional PCB, as part of a pre-existing PCB, or as an external module that is connected to the lamp through a wiring harness. As discussed herein, the Short Circuit Detection provides an interface between lamps that does not affect the performance of the system.

These and other features and advantages of the present invention will become apparent from the following description of the invention, when viewed in accordance with the accompanying drawings and appended claims.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION OF THE CURRENT EMBODIMENTS

Reference will now be made in detail to exemplary embodiments of the present invention, examples of which are illustrated in the accompanying drawings. It is to be understood that other embodiments may be utilized and structural and functional changes may be made without departing from the respective scope of the invention. Moreover, features of the various embodiments may be combined or altered without departing from the scope of the invention. As such, the following description is presented by way of illustration only and should not limit in any way the various alternatives and modifications that may be made to the illustrated embodiments and still be within the spirit and scope of the invention.

Figure 1:
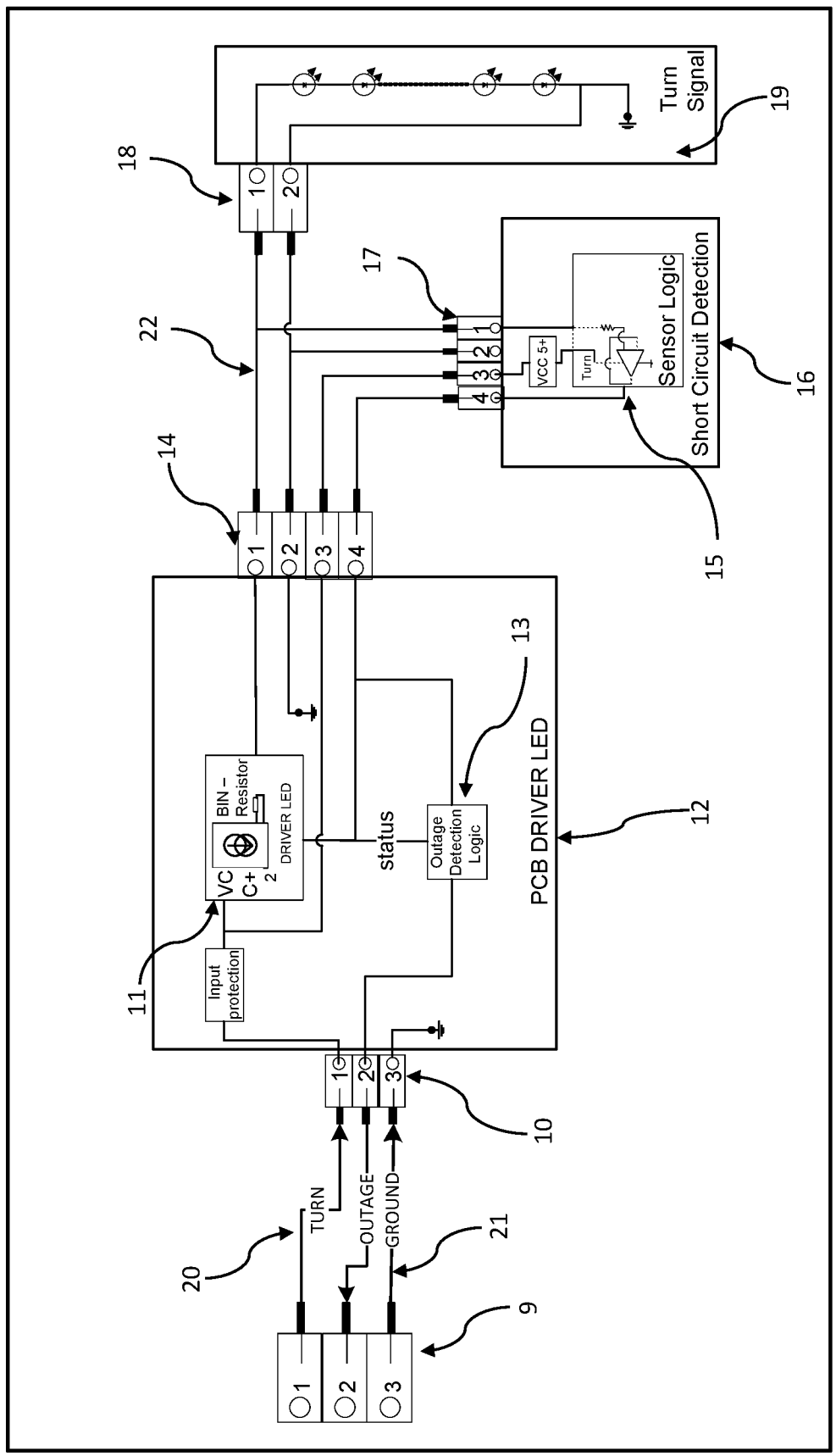
FIG. 1 illustrates an LED lighting circuit with short circuit protection integrated into the LED driver printed circuit board according to one or more embodiments shown and described herein.
Figure 2:
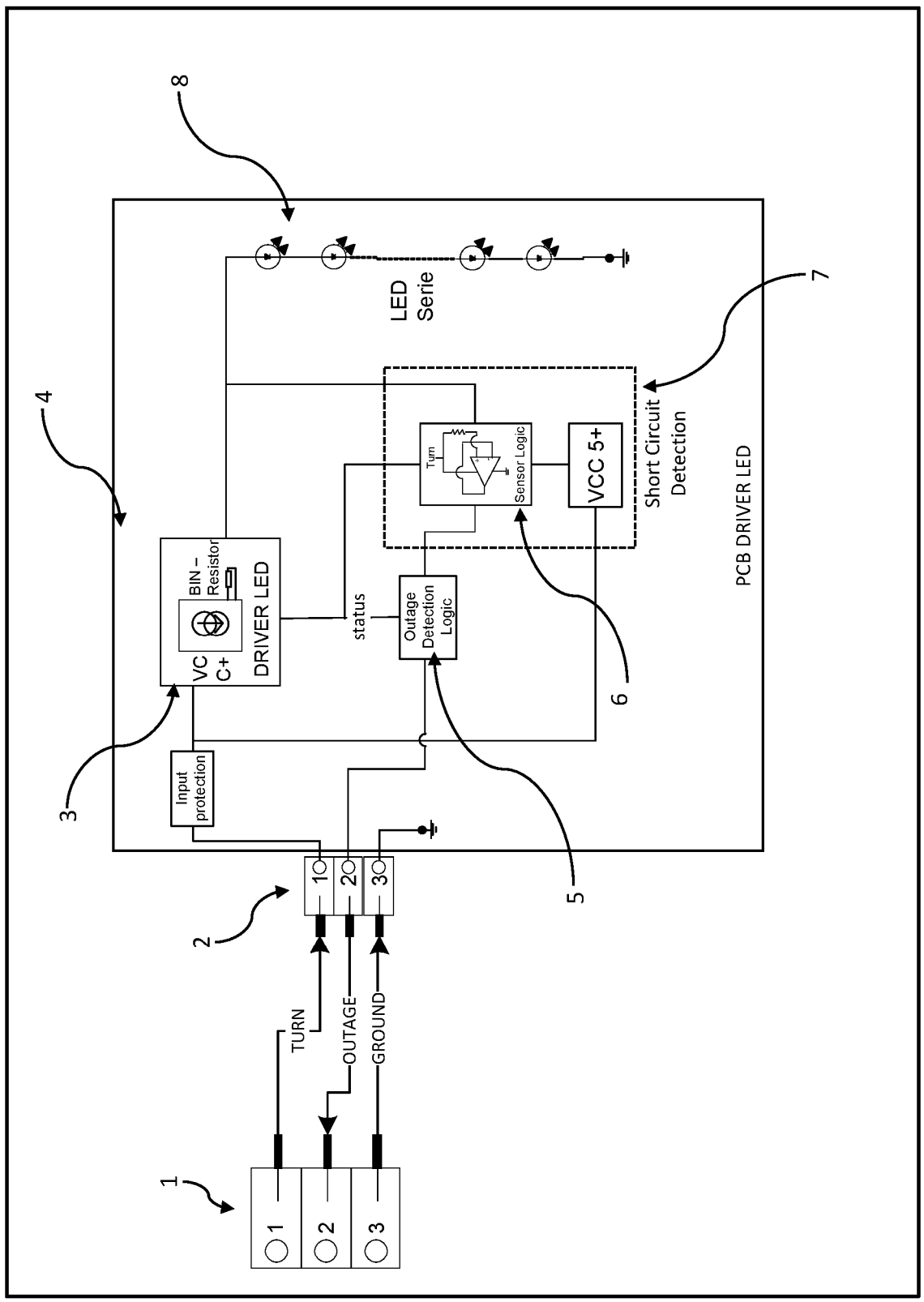
FIG. 2 an LED lighting circuit with short circuit protection remotely connected to the LED driver printed circuit board according to one or more embodiments shown and described herein.

FIG. 1 depicts a System that includes the Short Circuit Detection embedded in the PCB driver. With reference to FIGS. 1-2, an LED driver system 10 having a short circuit fault detection circuit 7 is generally presented. The short circuit fault detection circuit 7 may be generally referred to herein as the "fault detection circuit 7" or the "short circuit detection 7." The short circuit fault detection circuit 7 may be configured to sense a short circuit condition at one or more LEDs within an array 8 and provide a signal to a vehicle controller to inform the vehicle controller of the short circuit condition.

The system in FIG. 1 contains the electronics with the logic needed for the fault detection, which is located into the PCB driver. The Short Circuit Detection 7 includes an LED light source 8, and a LED driver 3, the electronics necessary to provide the outage detection signal to the BCM.

The system may contain a minimum of a 3 pin connector 1 & 2 with the following: a turn signal input, an outage output, and ground. The turn signal input is electrically connected to a lamp driver circuit 3 for activating the LED light sources 8. The outage output is electrically connected to the vehicle BCM and is HIGH or LOW dependent upon the presence or absence of a lamp outage, respectively.

Referring in the FIG. 2, depicts a System conformed by an external Short Circuit Detection module connected by harness, the System need meet with the failure mode One-out all-out, and a common outage detection signal that need be provided for the BCM of the vehicle.

The LED driver system may comprise a LED driver PCB 12 that houses components related to driving the LED array 19. The components may include an LED driver circuit 11, an outage detection logic 13, and optionally a short circuit detection 16, as described in further detail below. The LED driver circuit 11 be generally configured to receive a line voltage signal 20 and ground 21 and to drive an LED array 19 to turn on when the line voltage 20 is high. The line voltage signal 20 may be a turn signal to drive a turn signal LED array of a vehicle or may be any appropriate signal configured to turn on one or more LEDs. The LED array 19 may comprise one or more LEDs wired electrically in series, parallel, or series-parallel.

The LED driver system may be capable of detecting an outage condition, such as an outage caused by an open circuit condition, at the LED array 19. Specifically, the outage detection logic 13 may detect an open circuit condition. When an outage condition is detected by the LED driver system the outage detection logic 13 may provide a signal back to the vehicle controller to alert the vehicle of the fault condition. Specifically, the outage detection logic 13 may send a signal on an outage signal line. The vehicle controller may then receive the outage signal and may modify the operation of the LED array 19 accordingly. For example, the vehicle controller may cut off all power to the LED array 19 until the outage signal has been removed.

The LED driver system may, on its own, be unable to determine all types of faults and outages. For example, the LED driver system may be unable to detect a short circuit condition. Accordingly, the fault detection circuit 16 may be connected to the LED driver system 12 or to further provide short circuit detection.

The short circuit fault detection circuit 16 may be connected to the LED driver system in any appropriate manner. For example, as shown in FIG. 1, the fault detection circuit 7 may be embedded on the LED driver PCB 4. Specifically, the fault detection circuit 7 may comprise one or more circuits or microchips contained on a PCB 4 that also houses the LED driver circuit 3. In another embodiment, as shown in FIG. 2, the fault detection circuit 16 may be connected to the LED driver circuit 11 through an external connection to the LED driver PCB 12. The fault detection circuit 16 may comprise its own PCB or may be housed on another PCB that includes an external connection to the LED driver PCB 12.

The fault detection circuit 16 may be powered by a voltage signal, such as a 5 DC voltage signal. The fault detection circuit may include a voltage supply or regulator to regulate the input voltage. The fault detection circuit 16 may further include a sensor logic 15. The sensor logic 15 may be configured to monitor the voltage that is applied to the LED array 19. For example, the sensor logic 15 may connect to and monitor the output voltage from the LED driver circuit 11 to the LED array 19. When an LED within the LED array goes out due to a short circuit, the sensor logic 15 will detect a drop in voltage on the output voltage line 22. If the voltage drop on the output voltage line 22 exceeds a predetermined threshold, then the fault detection circuit 16 will send a short circuit detection signal to the outage detection logic 13. The short circuit detection signal will indicate to the outage detection logic 13 that an LED outage has been detected and, as described above, the outage detection logic 13 will provide the appropriate signal to the vehicle controller.

It will be appreciated that the voltage drop threshold for determining a short circuit condition may vary based on numerous characteristics of the LED array. For example, the type of LEDs used in the array, number of LEDs in the array, and other characteristics may alter or determine the appropriate threshold for determining a short circuit condition. The fault detection circuit 16 may be calibrated based on the LED array to determine the appropriate voltage drop threshold.

In the embodiment illustrated in FIG. 2, the fault detection circuit 16 may be connected to the LED driver PCB 12 at an external wire harness connection. For example, as shown, the fault detection circuit 16 may be spliced into the wire harness that interconnects the LED array 19 to the LED driver PCB 11 to monitor the output voltage signal 22. The fault detection circuit 16 may further connect directly to the LED driver PCB 12 to provide the short circuit detection signal.

The wireless Short Circuit Detection Module shown in FIG. 2 contains all the electronics necessary to generate and sense the Forward Voltage signal. FIG. 1 includes the interconnection between PCBs 9, 10, 14, 17, & 18. The first connector 9, 10 contains a turn signal input, an outage output, and ground. The additional connectors 14, 17, & 18. include the interconnection between Driver, PCB's, and Short Circuit Detection. The Short Circuit Detection module 16 is configured to sense the Forward Voltage of the LED string and provide to PCB driver a status signal in case of failure. The Short Circuit Detection 16 provides a HIGH output in the case of detecting a short circuit in a LED (via the status pin in the second connector 14) and a LOW output in the case that no failures are reported.

The above description is that of current embodiments of the invention. Various alterations and changes can be made without departing from the spirit and broader aspects of the invention. This disclosure is presented for illustrative purposes and should not be interpreted as an exhaustive description of all embodiments of the invention or to limit the scope of the claims to the specific elements illustrated or described in connection with these embodiments. Any reference to elements in the singular, for example, using the articles "a," "an," "the," or "said," is not to be construed as limiting the element to the singular.

The foregoing descriptions of specific embodiments have been presented for purposes of illustration and description. They are not intended to be exhaustive or to limit the present appended claims to the precise forms disclosed, and modifications and variations are possible in view of the above teaching. The exemplary embodiment was chosen and described to best explain the principles of the present invention and its practical application, to thereby enable others skilled in the art to best utilize the present system and method and its embodiments with modifications as suited to the use contemplated.

With respect to the description provided herein, it is submitted that the optimal features of the invention include variations in size, materials, shape, form, function and manner of operation, assembly, and use. All structures, functions, and relationships equivalent or essentially equivalent to those disclosed are intended to be encompassed by the present invention. It is noted that the terms "substantially" and "about" may be utilized herein to represent the inherent degree of uncertainty that may be attributed to any quantitative comparison, value, measurement, or other representation. Any values that may be modified by such terminology are also part of the teachings herein. For example, if a teaching recited "about 10," the skilled person should recognize that the value of 10 is also contemplated.

These terms are also utilized herein to represent the degree by which a quantitative representation may vary from a stated reference without resulting in a change in the basic function of the subject matter at issue.

As used herein, unless otherwise stated, the teachings envision that any member of a genus (list) may be excluded from the genus; and/or any member of a Markush grouping may be excluded from the grouping.

Unless otherwise stated, any numerical values recited herein include all values from the lower value to the upper value in increments of one unit provided that there is a separation of at least 2 units between any lower value and any higher value. As an example, if it is stated that the amount of a component, a property, or a value of a process variable such as, for example, temperature, pressure, time and the like is, for example, from 1 to 90, preferably from 20 to 80, more preferably from 30 to 70, it is intended that intermediate range values such as (for example, 15 to 85, 22 to 68, 43 to 51, 30 to 32 etc.) are within the teachings of this specification. Likewise, individual intermediate values are also within the present teachings. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner. As can be seen, the teaching of amounts expressed as "parts by weight" herein also contemplates the same ranges expressed in terms of percent by weight. Thus, an expression in the Detailed Description of the Invention of a range in terms of at "'x' parts by weight of the resulting polymeric blend composition" also contemplates a teaching of ranges of same recited amount of "x" in percent by weight of the resulting polymeric blend composition."

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The term "consisting essentially of" to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist essentially of, or even consist of the elements, ingredients, components or steps.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps. All references herein to elements or metals belonging to a certain Group refer to the Periodic Table of the Elements published and copyrighted by CRC Press, Inc., 1989. Any reference to the Group or Groups shall be to the Group or Groups as reflected in this Periodic Table of the Elements using the IUPAC system for numbering groups.

While particular embodiments have been illustrated and described herein, it should be understood that various other changes and modifications may be made without departing from the spirit and scope of the claimed subject matter.

Moreover, although various aspects of the claimed subject matter have been described herein, such aspects need not be utilized in combination.

It is therefore intended that the appended claims (and/or any future claims filed in any corresponding application) cover all such changes and modifications that are within the scope of the claimed subject matter.

The invention claimed is:

1. An LED short circuit detection system comprising:
an LED light source;
an incandescent light source; and
a failure detection circuit including:
    an LED driver circuit with a sensor logic adapted to monitor an input voltage supplied to the LED light source and an output voltage therefrom, and compare a differential of the input and output voltages to a threshold, for detecting an LED light source outage,
    an outage detection module adapted to monitor a current to the incandescent light source for detecting an incandescent light source outage, and
    an outage detection logic;
wherein the failure detection circuit is configured to detect a short circuit and transmit a lamp failure signal to the outage detection logic, which in turn provides an appropriate signal to a body control module to cause a driver warning in response to a detected light source outage.

2. A method of detecting a short circuit within an LED lighting system, the LED lighting system including an LED light source, an outage detection module, an LED driver circuit, a body control module, and an incandescent light source, the method comprising the steps of:
monitoring an input voltage supplied to the LED light source and an output voltage therefrom, for detecting an LED light source outage by the LED driver circuit;
comparing a differential of the input and output voltages to a threshold;
monitoring by the outage detection module a current to the incandescent light source for detecting an incandescent light source outage;
transmitting a lamp failure signal to the body control module, if the differential falls below the threshold, to cause a driver warning in response to a detected light source outage; and cutting off all power to the LED light source until the lamp failure signal has been removed.

3. The LED short circuit detection system according to claim 1, wherein the voltage is a forward voltage.

4. The LED short circuit detection system according to claim 3, wherein the LED driver circuit is an external module that is connected to the LED light source through a wiring harness.

5. The LED short circuit detection system according to claim 3, wherein the LED driver circuit is embedded on an LED driver PCB that connects to the LED light source.

6. The LED short circuit detection system according to claim 3, comprising a plurality of the LED light source; wherein the plurality of LED light sources are wired electrically in series.

7. The LED short circuit detection system according to claim 3, comprising a plurality of the LED light source; wherein the plurality of LED light sources are wired electrically in parallel.

8. The LED short circuit detection system according to claim 3, comprising a plurality of the LED light source; wherein the plurality of LED light sources are wired electrically in series-parallel.

\* \* \* \* \*